United States Patent [19]
Kump
[11] 3,767,493
[45] Oct. 23, 1973

[54] TWO-STEP PHOTO-ETCHING METHOD FOR SEMICONDUCTORS

[75] Inventor: Herbert J. Kump, Essex Junction, Vt.

[73] Assignee: International Business Machines Corporation, Armonk, N.Y.

[22] Filed: June 17, 1971

[21] Appl. No.: 154,102

[52] U.S. Cl. .......... 156/17, 96/36
[51] Int. Cl. .......... H01l 7/50
[58] Field of Search .......... 156/7; 96/36

[56] References Cited

UNITED STATES PATENTS 3,576,630 4/1971 Yanagawa .......... 96/36

OTHER PUBLICATIONS

System for Etching Al Layers Minimizes Bridging & Undercutting. p. 12 June, 1967, SCP and Solid State Technology

*Primary Examiner*—Jacob H. Steinberg
*Attorney*—Howard J. Walter, Jr. et al.

[57] ABSTRACT

A method of selectively etching a substrate to form areas of a predetermined depth by first etching through an etch resistance mask to a substantial portion of the depth to be etched, removing the etch resistant mask and, finally, etching the remaining material in the selective areas by exposing the substrate to a second etchant. The method prevents contaminants from the first etchant, the etch mask and the original surface to be etched from contacting the finally etched surface of the second etch step.

7 Claims, 7 Drawing Figures

INVENTOR
HERBERT J. KUMP

BY Howard J. Walter, Jr.
ATTORNEY

TWO-STEP PHOTO-ETCHING METHOD FOR SEMICONDUCTORS

BACKGROUND OF THE INVENTION

1. Field of the Invention

This invention relates to methods of etching and more particularly to an improved method of photo-etching wherein an etch resistant mask is used to define areas to be etched.

2. Description of the Prior Art

In the manufacture of semiconductor devices, particularly metal-oxide-semiconductor field effect transistor (MOSFET) devices, non-contaminated surfaces are essential to successful device operation and reliability. In the manufacturing process numerous etching steps are needed to produce holes or apertures through one or more layers of material in order to fabricate various elements of individual devices. For example, in the manufacture of MOSFET devices, it is necessary to remove a layer of protective oxide from over the gate region in order to re-grow a clean thin oxide. It has been the practice of the prior art to perform etching processes as follows.

Assuming that it is desirable to etch a hole through a protective oxide layer covering a partially processed semiconductor wafer, a photographic mask is used to selectively expose areas of a previously deposited photoresist such as, for example, Kodak Photo Resist (KPR). After exposure, the unexposed areas of the photoresist are rinsed away leaving an etch resistant mask defining the location of holes to be etched. An etchant, such as hydrofluoric acid, may be used to etch the exposed protective oxide down to the semiconductor surface. The photoresist is then removed by an organic solvent and, depending on the criticality of the presence of a contaminated surface, the entire substrate may be cleaned by one or more organic or inorganic cleaning baths. The cleaning baths may or may not involve a chemical reaction, such as displacement, but do not substantially affect the size or shape of the etched hole.

One of the problems created by the above prior art technique is that the exposed semiconductor surface is exposed in the same system as the photoresist, etchant, cleaning solutions, etc. This condition provides a vast source of uncontrollable amounts and species of contamination, particularly when etching areas for the growth of MOSFET gate oxides. These contaminants are frequently unidentified and difficult, if not impossible, to remove without destroying the integrity of the partially completed semiconductor device.

Another problem currently found in the manufacture of MOSFET devices is contamination of the semiconductor surface previously exposed and the re-grown "clean" gate oxide when the oxidation step is performed after source-drain diffusion. The diffusion, drive-in and oxidation steps produce a doped layer in the protective oxide surfaces surrounding the source-drain areas. When the gate oxide is thermally re-grown at an elevated temperature some of this previously deposited dopant in the oxide out-diffuses and results in the doping of the exposed semiconductor surface and growing gate oxide resulting in unstable operation of the completed device.

Another etching technique of the prior art is that taught by Davidse et al, U.S. Pat. No. 3,474,021, assigned to the assignee of the instant invention. The technique of the patent subtractively sputters partially through a layer of material to be etched in an area defined by a photoresist mask and thereafter chemically etches the remainder of material to be etched. This method presents two problems with respect to contamination. The first is that the photoresist mask is not removed until after the chemical etching step thereby exposing all contaminants in the mask to the finally etched surface. The second problem relates to the extreme difficulty experienced in removing the photoresist mask after being exposed to the sputtering atmosphere. Other two-step etching processes are known but present the same problems as already referred to and do not reduce contamination.

SUMMARY OF THE INVENTION

It is, accordingly, a primary object of this invention to reduce the presence of contaminating impurities in semiconductor devices which include etching steps during their manufacture.

It is another object of this invention to provide an improved method of etching without any substantial change in current processing technology.

It is a further object of this invention to improve the quality of semiconductor devices without an increase in manufacturing costs.

It is yet another object of this invention to improve the quality of products produced by one or more etching processes.

In accordance with the broad aspects of the present invention the above and other objects are achieved by modifying the etching process of the prior art such that only a portion of the total thickness of the material to be etched is removed while the teeth resistant mask is in place. After initial etching the mask is removed, the substrate cleaned and then the entire surface of the substrate is etched to complete removal of the material in the area previously defined by the mask and at the same time to remove a portion of the material in the previously masked areas. As will be illustrated below, this method may be performed utilizing existing technology while at the same time improving the quality of the product produced. The method of the invention reduces contamination problems by limiting the source of contaminants and allows more acceptable control of unavoidable contamination. By utilizing this two-step etching process most impurities are removed from the etching system prior to the exposure of the area of interest.

The foregoing and other objects, features and advantages of the invention will be apparent from the following more particular description of the preferred embodiment of the invention, as illustrated by the accompanying drawings.

DESCRIPTION OF THE PREFERRED EMBODIMENT

In order to more clearly illustrate the preferred embodiment of the invention, reference will be made to one particular etching step in the manufacture of an MOSFET. It will be recognized by those skilled in the art that the described method is not so limited but will be useful in any etching process where it is desirable to reduce the contamination of a surface intended to be exposed by etching a material to a predetermined depth.

Figure 1:
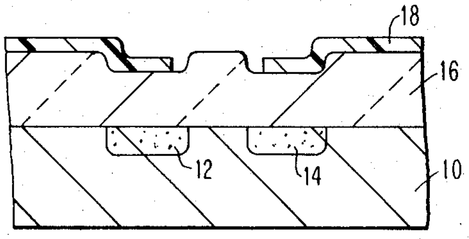
FIG. 1 PRIOR ART
FIG. 1 is a sectional view of a partially fabricated MOSFET device prepared for etching.

Referring now to FIG. 1, there is represented a cross section of a portion of a doped crystalline semiconductor 10 from which a single one of a plurality of transistor units is to be fabricated. As will be understood, in the microminiaturized fabrication of the semiconductor devices the fabrication process usually involves fabrication of a large array of semiconductor units, which may comprise several hundred, on a parent semiconductor wafer. For a teaching of the basic steps for the fabrication of an MOSFET, reference may be made to any number of standard texts on the subject, such as "Characteristics and Operation of MOS Field Effect Devices," by P. Richman, McGraw-Hill (1967).

As shown in FIG. 1, there is provided two diffusions 12 and 14 representing the source and drain regions of the device being fabricated. Covering the surface of semiconductor 10 is a protective oxide layer 16 composed of an original protective oxide layer, not delineated, and a diffusant-formed oxide created during the standard diffusion step. The portion of protective layer 16 in the area between diffusions 12 and 14 is not suitable as a gate dielectric due to its excessive thickness and irregular electrical characteristics. Accordingly, the portion of layer 16 lying over the gate region must be completely removed as a new "clean" oxide grown. In order to selectively mask a substrate to define the gate area a photoresist, such as KPR, is applied to the protective oxide 16, exposed and developed to form the etch resistant mask 18.

Figure 2:
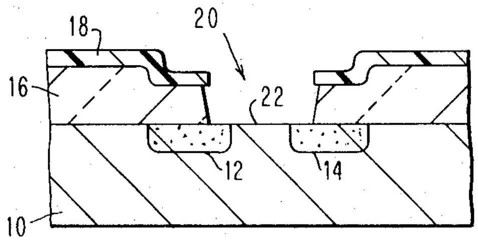
FIG. 2 is a sectional view showing the device of FIG. 1 after etching by the prior art method.

FIG. 2 shows the results of etching the gate area as taught by the prior art. The masked substrate is subjected to an etchant, such as hydrofluoric acid, which attacks the exposed oxide layer 16. Because the etchant, normally used will not attack semiconductor 10, etching is continued until it is quite certain that all of oxide layer 16 in the unmasked gate area has been removed, leaving an aperture 20 in oxide layer 16. Thereafter, the substrate may be rinsed in de-ionized water or cleaned with a cleaning solution intended to remove known surface contaminants. This last step may or may not be performed prior to removing etch resistant mask 18. Whether mask 18 is removed before or after the cleaning step is immaterial for impurities contained in the mask itself or the solvent used to remove it will be presented to the exposed surface 22 creating further contamination which may be difficult or impossible to remove. Devices fabricated according to the above process are commonly found to exhibit out-of-specification parameters resulting in a low overall yield of useable devices.

Figure 3:
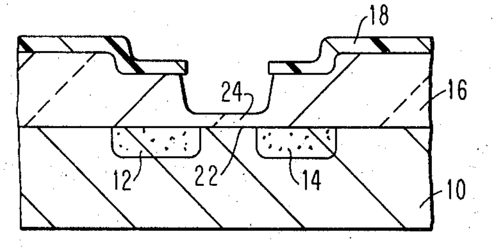
FIGS. 3, 4 and 5 are sectional views of the device as in FIG. 1 at various steps in the etching process of the instant invention.
Figure 4:
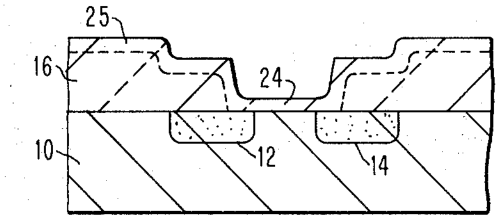
Figure 5:
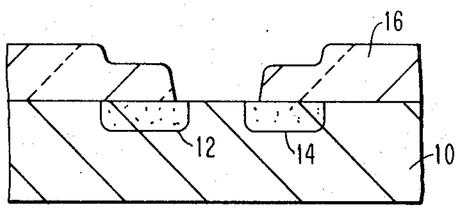

Referring now to FIGS. 3, 4 and 5 showing the steps of the present invention, it will be seen that contamination of surface 22 (FIG. 2) can be significantly reduced by practicing the instant method. Surface 22 represents the top of semiconductor 10 which is the interface between semiconductor 10 and oxide 16. According to the etching method herein disclosed, the device may be fabricated to the point indicated in FIG. 1 by any method known in the prior art. Etch resistant mask 18 is applied as previously described. However, instead of completely etching through protective oxide layer 16 in a single etching step, only a predetermined thickness, equal to a substantial thickness of layer 16, is etched, leaving a thin layer 24 of protective oxide over surface 22. Retained layer 24 should be relatively thin and may be about 100–400 angstroms thick and preferably about 200 angstroms thick. The purpose of layer 24 at this point is to prevent any contaminants carried by photoresist mask 18 or the etchant used in this first etch step from being deposited on, absorbed by or diffused into semiconductor 10 at surface 22. It should be noted that the presence of layer 24 enables much wider choice in the selection of etchants than heretofore possible. The single step etching technique of the prior art usually requires that the etchant selectively attack the protective oxide only, that the etchant not contain certain impurities, etc. Since the etchant of the first step of the instant invention never "sees" the final etched surface 22, the purity requirements need not be as stringent as in the prior art. This allows lower cost etchants to be used.

The next step, as shown by FIG. 4, is to entirely remove etch resistant mask 18 from the surface of the substrate using any suitable solvent well known in the art depending upon the material of mask 18. It should be noted that in the prior art techniques the choice of solvents useable to remove mask 18 may be severely limited due to their effect on surface 22. This problem is avoided in the instant method due to the presence of layer 24 which still protects surface 22 at this point in the process.

FIG. 5 illustrates the structure resulting from the last step of this invention. After the etch resistant mask has been removed, it may be desirable to clean the exposed surface of layer 16. This may be accomplished by any of the cleaning methods well known in the art. Finally, the entire surface of the substrate is subjected to an etchant to complete etching through layer 24 to expose surface 22. The etchant for this step may, of course, be the same type of etchant used in the previous etching step but it may be preferable to use a high purity material, or etchant, to further reduce contamination. Because layer 24 is relatively thin a slower acting etchant may also be used. This may be accomplished by reducing etchant concentration or by utilizing a different etchant entirely. For example, to etch silicon dioxide commercial grade 48 percent hydrofluoric acid might be used as a first etchant and high purity ammonium fluoride buffered hydrofluoric acid for the second. During this etch step it will be noted that a small thickness of the previously masked surface of oxide layer 16, as shown by the dashed line 25 in FIG. 4, is also removed. This is desirable because it enables the removal of contamination present at the surface of protective oxide 16 formed by the diffusion process. This is important in view of the fact that it has been found that when the gate oxide is re-grown after etching by the prior art technique, impurities in the previously masked oxide layer out-diffuse and deposit on the gate oxide. The instant method substantially reduces this source of contamination.

Although the invention has been described with respect to a particular application those skilled in the art will recognize that the method has application in any etching process where there is a possibility that contaminating species carried by an etch mask and/or etchant will adversely affect the final surface to be etched.

Figure 6:
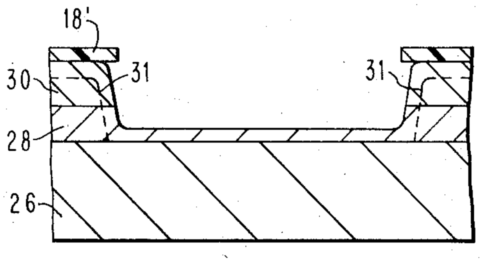
FIGS. 6 and 7 are sectional views of structures illustrating alternative embodiments upon which the instant invention is also operable.

In addition, as shown in FIG. 6 the instant method is not limited to etching a single layer but may be used to etch several layers. FIG. 6, corresponding to FIG. 3, shows the intermediate results of the instant method when two layers cover the area to be exposed. A substrate comprising a support member 26 covered by and in contact with a first layer 28 of material to be etched which in turn is covered by a second layer 30 is shown in FIG. 6. Etch resistant mask 18' defines the area to be etched during the first etching step. The thickness of layers 28 and 30 represent a predetermined depth to be etched. As shown, the first etch step etches a substantial portion of that predetermined depth and extends into first layer 28. After removal of the etch mask 18' the entire substrate is etched to complete the process resulting in the structure as defined by the dashed lines 31 in FIG. 6 and exposing the top surface of member 26.

Figure 7:
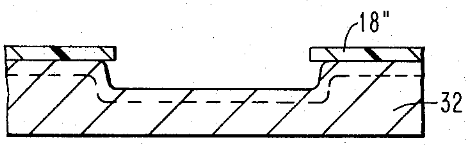

FIG. 7 shows another application of the subject method where it may be desirable to etch an aperture in the surface of a substrate not covered by a layer of another material. For example, it is sometimes desirable to form depressions in a semiconductor wafer surface for subsequent epitaxial deposition. Substrate 32 is provided with an etch resistant mask 18'' to define the area to be etched and the method is carried out as described above.

It should be understood that the term predetermined depth, as used throughout the specification and claims herein, refers to that distance measured from the original surface of the material to be etched to the surface obtained after the second etch step. Additionally, if a selective etchant may not or is not used for etching, as in producing an aperture in a single material substrate, such as shown in FIG. 7, close control of etch time and rate must be provided to insure that the desired depth is accurately reached.

In all the above applications it should be realized that the resulting thickness of the protective layers obtained will be somewhat less than that which would be obtained by using the prior art method on the same original layer thickness. Accordingly, it will be obvious that it may be desirable to initially start off with a thicker structure than that used by the prior art. The problem is particularly important in semiconductor manufacturing due to the criticality of the thickness of protective oxide layers.

Although only chemical etching has been referred to, it should be pointed out that the subject invention has application in any etching process, such as sputtering, electroerosion, etc. Different types of etching processes may be used for the first and second etching steps.

The advantages of the present invention lie in its ability to substantially reduce contamination of an etched surface in a photoresist etching process.

While the invention has been particularly shown and described with reference to referred embodiments thereof, it will be understood by those skilled in the art that the foregoing and other changes in form and details may be made therein without departing from the spirit and scope of the invention.

What is claimed is:

1. A method of selectively etching apertures in a substrate comprising a semiconductor body to a predetermined depth, said method comprising the steps of:

selectively masking the semicondctor substrate with a photoresist mask;

etching said semiconductor substrate through said mask with a first etchant to a depth equal to a substantial portion of the predetermined depth;

removing said photoresist mask; and then in the absence of further photoresist masking material on said substrate;

etching the substrate with a second etchant of higher purity than the first etchant until the previously etched areas have a depth equal to the predetermined depth.

2. The method of claim 1 wherein said substrate comprises a semiconductor body covered with a protective oxide layer and wherein said protective oxide layer has a thickness equal to said predetermined depth.

3. The method of claim 1 wherein said semiconductor substrate comprises a semiconductor material support member covered by at least a first layer of dielectric material to be etched and a second layer of dielectric material to be etched, said first layer contacting said support member and said second layer contacting said first layer and wherein the thickness of said layers equals said predetermined depth and further wherein said substantial portion of said predetermined depth extends into said first layer.

4. Method of claim 3 wherein said predetermined depth exceeds said substantial portion of said predetermined depth by about 200 angstrom units.

5. The method of claim 1 wherein after the removing of said photoresist mask and prior to the final etch step the following step is added:

cleaning the surface of the substrate to remove contaminants caused by the photoresist mask and the mask removal step.

6. A method of selectively removing a protective dielectric layer from the surface of a semiconductor wafer comprising:

selectively forming a photoresist masking layer on said protective dielectric layer to define exposed areas of said protective dielectric layer;

etching with a first etchant a substantial portion of the thickness of said protective dielectric layer in exposed areas;

removing said masking layer; and then, in the absence of further photoresist masking material on said protective dielectric layer, subjecting said partially etched protective layer to a second etchant of higher purity than said first etchant to etch through the remaining portion of the thickness of said protective dielectric layer in the original exposed areas.

7. The method of claim 6 wherein prior to etching the remaining portion of said protective layer the wafer is cleaned to remove contaminants.

* * * * *